SEMICONDUCTIVE DEVICE AND METHOD FOR THE FABRICATION THEREOF

Filed May 18, 1956

INVENTOR.
ALBERT D. RITTMANN
BY
Allen U. Hazeltine
ATTORNEY

United States Patent Office 2,870,052

Patented Jan. 20, 1959

2,870,052

SEMICONDUCTIVE DEVICE AND METHOD FOR THE FABRICATION THEREOF

Albert D. Rittmann, Huntingdon Valley, Pa., assignor to Philco Corporation, Philadelphia, Pa., a corporation of Pennsylvania Application May 18, 1956, Serial No. 585,670

10 Claims. (Cl. 148—33)

This invention relates to semiconductive devices and to methods for the fabrication thereof; more particularly it relates to such devices and methods which are useful in providing amplifiers of high frequency signals.

Semiconductive devices are known which employ junctions, i. e. transitions in the concentrations of impurity atoms in a semiconductive body, as emitters of minority-carriers into semiconductive bodies and as collectors of minority-carriers from such bodies. For example, such junctions are utilized in the well-known junction transistor as emitter and collector elements, and may be fabricated by any of a variety of processes such as by nuclear bombardment of a body of semiconductive material, by controlled variation of impurity concentration in a melt of semiconductive material during crystal growth, or by alloying of an appropriate impurity metal with a surface region of a semiconductive body to alter the conductivity thereof in the alloyed region. For many purposes, it is important to be able to control the precise geometry of such junctions with a high degree of accuracy. For example, such accurate control is highly important in fabricating high frequency transistors, since the maximum frequency of operation tends to increase as the emitter and collector junctions are made smoother, more closely-spaced and more nearly plane-parallel.

In addition to accurately controlled junction geometry, it is generally desirable that a junction emitter possess the highest possible value of injection efficiency, designated herein as "gamma" and defined as the percentage of the total current through the emitter junction which is carried by charge carriers of the desired type (i. e. holes or electrons). The value of gamma limits the value of alpha obtainable from the transistor and hence the maximum amplification, and, in usual types of commercial junction transistors in which the alpha is less than unity, the value of gamma represents the upper limit of values of alpha which can be obtained. Furthermore, high values of gamma are advantageous in increasing the common-base output impedance of such devices.

Although the alloy-junction transistor presently appears to be the type of junction transistor which lends itself most readily to commercial mass production, in its usual forms it is limited with respect to its maximum frequency of operation, as compared to the surface-barrier transistor for example, because of the difficulty of obtaining reproducibly the optimum geometry of collector and emitter. Such a junction transistor is conventionally fabricated by relatively deep alloying of an appropriate impurity metal into opposite sides of a relatively thick blank of semiconductive material, with the result that the opposed emitter and collector junctions thus formed are typically irregular or jagged, depart substantially from the desired plane-parallel geometry, and are spaced from each other by amounts critically dependent upon the alloying cycle and hence highly susceptible to minor variations in the fabricating procedure.

Accordingly, it is an object of my invention to provide a new semiconductive device of improved characteristics, as well as a novel method for fabricating the device.

It is also an object to provide a new and improved form of minority-carrier emitter.

Another object is to provide an emitter of minority-carriers which is efficient in its operation and, at the same time, of accurate geometric configuration.

A further object of the invention is to provide a transistor having smooth, substantially plane-parallel emitter and collector junctions, and a relatively high injection efficiency.

A still further object is to provide a novel method for fabricating such a transistor.

Another object is to provide a method for fabricating a transistor comprising a pair of opposed junctions of accurately-controlled geometry and a base connection to the semiconductive body, which method is particularly simple and adapted for mass production.

Still another object is to provide a transistor having both a high value of alpha and a high maximum operating frequency.

In accordance with the invention, there is provided an emitter of charge carriers of a first type comprising a body of semiconductive material having a thickness substantially less than the diffusion length therein for carriers of the type opposite to said first type, and containing a concentration of ionized activator impurity atoms sufficient to reduce substantially the mobility in said body of carriers of said opposite type. Typically, the semiconductive body of the emitter is contiguous to, and integral with, the semiconductive body into which minority-carriers are to be injected, and has a conductivity such as to produce a rectifying barrier at the boundary between the two bodies. The thickness of the emitter region is then defined by the distance between this boundary and the emitter connection, which is ordinarily a substantially ohmic contact. In the device of the invention, this thickness is less than about 0.01 mil, and preferably of the order of 0.001 mil or less, while the ionized activator-atom concentration is sufficient to produce an average equilibrium concentration of excess charge carriers of more than about $10^{18}$ carriers per cubic centimeter. These carrier concentrations correspond to emitter region resistivities of less than about 0.01 ohm-centimeter, and in a preferred embodiment the carrier concentration is greater than $10^{19}$ carriers per cubic centimeter, producing an emitter region resistivity of about 0.0005 ohm-centimeter.

In accordance with the invention in another aspect, the emitter region is formed by first shaping the semiconductive body into which minority-carriers are to be emitted to provide a surface region having the configuration desired for the emitter junction, and then forming, upon the shaped surface region, a melt containing an activator substance of the type required to produce the desired junction and having a solid solubility in the semiconductor sufficient to provide the required high excess-carrier concentration in the emitter region after cooling and solidification of the melt. This melt is preferably formed by jet plating at least one of the constituents upon the semiconductor surface to provide intimate contact and excellent wetting even at low alloying temperatures, thereby to define accurately the area of the emitter region. The material of the melt is maintained for a short period of time at a low temperature just sufficient to dissolve the semiconductive material to a depth of less than about 0.01 mil, and is then cooled to form the desired P–N junction and extremely thin emitter region.

In a preferred embodiment, the semiconductive body is of N-type germanium, the activator material is gallium, and the melt is maintained for about three seconds at about 170° centigrade and then cooled to cause it to solidify. It is also preferred to include in the melt, in addition to the activator material, a metal which wets well the semiconductor surface, which has mechanical properties suiting it for use as an emitter contact, and which has a relatively low melting point. The latter metal also preferably has a solid solubility in the semiconductor less than that of the activator material, and exhibits no tendency to reduce substantially the solid solubility of the activator material in the semiconductor. Indium has been found to be a suitable material for this purpose when the activator material is gallium.

Because of the extreme thinness of the emitter of my invention, the emitter junction has a configuration substantially identical with that of the surface of the semiconductive body prior to the alloying step. The desired configuration of emitter junction is therefore readily obtained by accurately shaping the surface of the semiconductive body prior to alloying, as by the jet-electrolytic etching method described in the copending application Serial No. 472,824 of J. W. Tiley and R. A. Williams, entitled Semiconductive Devices and Methods for the Fabrication Thereof, and filed December 3, 1954. Furthermore, in fabricating a complete transistor device embodying the invention, the spacing between the emitter and an opposed collector element may be accurately controlled by forming the emitter in a surface of a semiconductive body of accurately controlled thickness, and forming the collector element at or near the surface of the body opposite the emitter element. Although in such case the collector element may be of the surface-barrier type, it may also conveniently be of the same ultra-shallow alloy type as the emitter. Since the thicknesses of both emitter and collector regions are then very small, the thickness of the base region between them may also be very small, e. g. 0.1 mil, without being critically dependent upon the percentage accuracy of the depth of alloying. An emitter junction closely and uniformly spaced from the collector element is therefore readily provided, and improvements in high frequency operation of the resultant transistor thereby obtained.

In addition, the gamma of a junction emitter so constituted and formed is sufficiently high to provide excellent values of transistor alpha, because of the use of an ionized activator impurity concentration in the emitter of more than $10^{18}$ atoms per cubic centimeter, for which concentrations the mobility in the emitter region of carriers of the type opposite to that to be emitted has been found to decrease substantially with increases in concentration. While the reasons for requiring this unusually high impurity concentration and lowered mobility will be set forth fully hereinafter, the general effect of the decreased mobility thus produced is to counteract a tendency of the very close spacing between emitter connection and emitter junction to decrease gamma by increasing greatly the component of current through the emitter junction carried by carriers of the undesired type.

Utilizing the above-described construction and fabrication procedure, I have found that the maximum operating frequencies and the values of alpha obtainable from mass-produced transistors may be greatly increased.

In addition, by applying the activator material together with a much larger amount of another metal having a lower solid solubility in the semiconductor than does the activator material, the electrical properties of the emitter region may be determined substantially entirely by the nature of the activator material, while the extent of alloying and the physical properties of the emitter contact are determined in large measure by the characteristics of the metal of the principal constituent. The latter material may then be selected from a wide range of materials without regard to its activator effects. Furthermore, because of low alloying temperatures which may be employed, the alloying procedure may be performed after soldering of the base connection to the semiconductive body, thus providing an additional degree of freedom in the fabrication of such devices.

Other objects and features of the invention will become more apparent from a consideration of the following detailed description, taken in connection with the accompanying drawings, in which.

Figure 1:
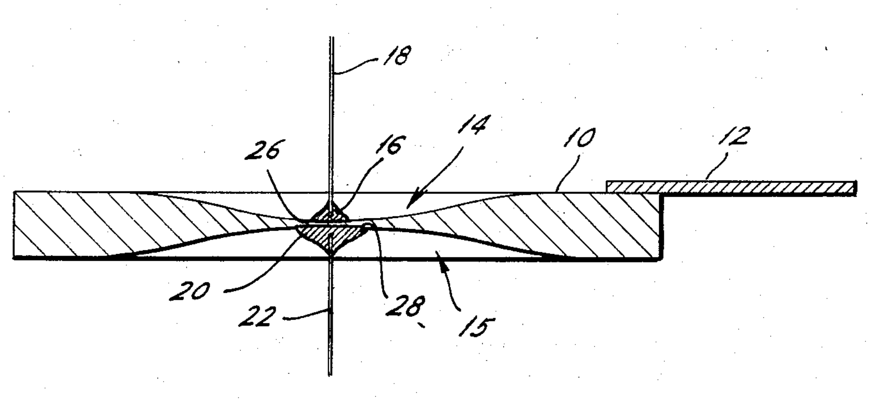
Figure 1 is a sectional view illustrating a transistor embodying the invention.
Figures 2, 3:
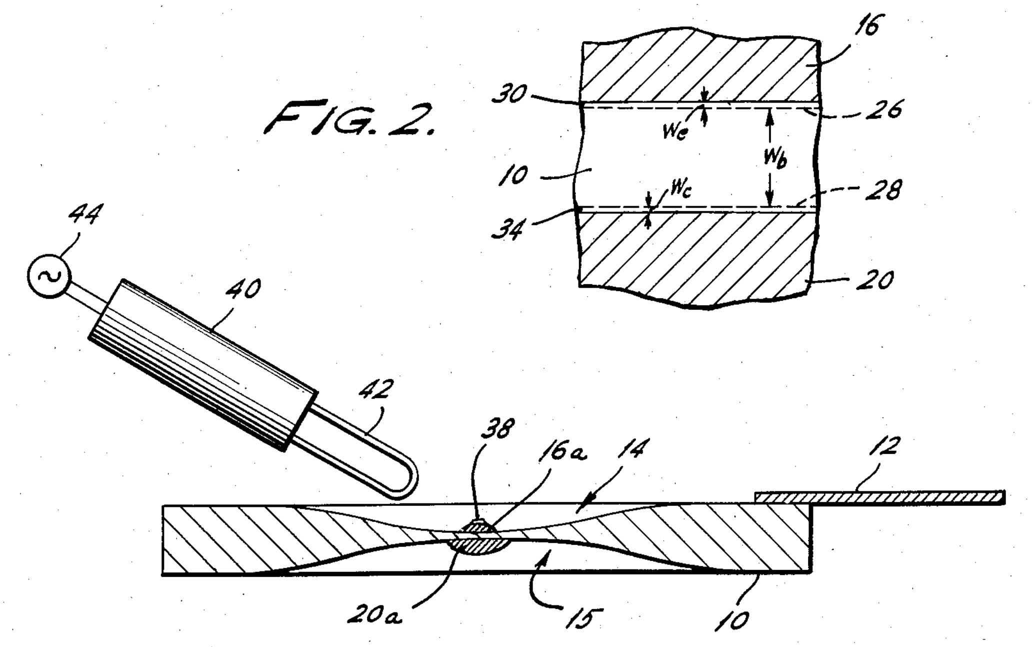
Figure 2 is an enlarged, fragmentary, sectional view, showing in more detail the central portion of the device illustrated in Figure 1.
Figure 3 is a representation, partly in section and partly in full, to which reference will be made in describing a method for fabricating a device of the type illustrated in Figure 1.

Referring now to Figures 1 and 2 in more detail, in which like parts are indicated by like numerals and in which the several elements thereof are not necessarily to scale, the general form of the structure shown is similar in configuration to that employed in the surface-barrier transistor described in the copending application Serial No. 472,826 of R. A. Williams and J. W. Tiley, filed December 3, 1954, entitled "Semiconductive Device," and of common assignee herewith, although differing importantly therefrom in that in the device of Figure 1 the emitter and collector elements comprise junctions of special characteristics, rather than surface-barrier contacts. Thus, in Figure 1 there is shown a body of semiconductive material 10 having a base tab 12 ohmically soldered thereto, and provided with a pair of opposed, substantially flat-bottomed, depressions 14 and 15. A body of metal 16 serves as an emitter connection for the device, to which an appropriate emitter lead wire 18 is soldered, while another body of metal 20 provides a collector connection to the collector region of body 10, and is provided with a suitably soldered collector lead wire 22. Substantially plane-parallel, opposed junctions 26 and 28, indicated more clearly by dotted lines 26 and 28 in Figure 2, are provided in semiconductive body 10 beneath emitter contact 16 and collector contact 20, respectively.

Referring particularly now to Figure 2, the emitter region of the transistor comprises the region 30 of thickness $W_e$ between the emitter junction 26 and the metallic connection 16, while the collector region 34 comprises the region between the collector junction 28 and the collector contact 20. The semiconductive material of thickness $W_b$ between the two junctions then comprises the base region of the transistor.

In accordance with the invention, at least the emitter region 30 is extremely thin and, when formed in the preferred manner by alloying of metal into the surface of the semiconductive body, the emitter junction 26 is therefore substantially exactly parallel to the original surface of the semiconductive body 10. More particularly, in accordance with the invention the thickness $W_e$ of the emitter is less than 0.01 mil, and is preferably of the order of 0.001 mil or less. Similarly, the collector region 34 may have a comparably small thickness $W_c$, and its geometry is therefore determined substantially entirely by the configuration of the surface of the semiconductive body 10 immediately adjacent thereto. Since the original surface regions of the semiconductive body at the bottoms of depressions 14 and 15 are substantially plane-parallel, the junctions 26 and 28 are also substantially plane-parallel, as shown. Furthermore, since the depth of alloying required to produce the thin emitter and collector regions 30 and 34 may be a relatively small proportion of the total base width $W_b$, and since the total thickness of the semiconductive body may be accurately controlled during excavation of the opposed depressions, the base width $W_b$ may be accurately predetermined even in mass-production. Because of the thin base widths and precisely plane-parallel emitter and collector junctions which may be obtained in this manner, extremely high frequencies of operation are obtained.

When employing emitter regions of such extreme thinness, I have found that, in order to obtain high values of alpha in a transistor, the thin emitter region 30 should contain an average concentration of ionized actuator impurity atoms of more than about $10^{18}$ atoms per cubic centimeter, and preferably at least $10^{19}$ atoms per cubic centimeter. Since the number of free charge carriers is substantially equal to the number of ionized impurity atoms, the number of free charge carriers per cubic centimeter is also greater than about $10^{18}$; for example, where the body is of N-type germanium, a concentration of greater than about $10^{18}$ unbound holes per cubic centimeter exists in the emitter region 30. In a preferred embodiment, the collector region 34 may contain a similar concentration of excess charge carriers so that a high reverse alpha may be obtained.

While I do not wish to be bound by the details of any specific theory, the following considerations have been found helpful in understanding and applying the invention in various forms. When emitter regions having thicknesses $W_e$ of the order of 0.001 mil are employed, the injection efficiency gamma of the emitter has been found to be undesirably low if ordinary concentrations of impurity atoms are employed in the emitter region. Considering for convenience a specific case in which the base region is of N-type germanium, such relatively low values of gamma obtain because of an unduly large flow of undesired electron-current from the base region into the emitter region 30 when the junction 26 is forward-biased, as for normal transistor action. This large electron current is produced by the proximity to the emitter junction of the substantially ohmic contact provided by contact 16, for the following reasons. With such a small emitter region thickness, the concentration gradient of conduction electrons in the emitter region, when the emitter is forward-biased, is determined by the width of the emitter region, rather than by the value of diffusion length characteristic of the material of which the emitter region is comprised. More particularly, the electron component of the emitter current in such a thin P-type emitter region has been found to vary substantially in inverse proportion to the width $W_e$ of the emitter region, and hence to increase rapidly as $W_e$ approaches zero. Since variations in the width of the emitter produce little or no effect upon the desired hole component of the emitter current, the small value of $W_e$ existing in a very thin emitter region tends to reduce substantially the injection efficiency, gamma, of such an emitter.

However, I have found that the low injection efficiencies otherwise obtained with extremely thin emitter regions may be counteracted by utilizing in the emitter regions the unusually high ionized impurity-atom concentrations specified hereinbefore. More particularly, I have found that when the emitter region 30 is doped with an activator impurity sufficiently heavily to produce a concentration of excess charge carriers therein of more than about $10^{18}$ carriers per cubic centimeter, and preferably $10^{19}$ or more carriers per cubic centimeter, the mobility of the undesired type of carriers in the emitter region is greatly reduced. Although at moderate or low carrier concentrations this mobility appears to be substantially independent of concentration, as the carrier concentration is increased beyond about $10^{18}$ carriers per cc., the mobility decreases substantially in inverse proportion to the two-thirds power of the carrier concentration. Since the undesired current component across the emitter junction is substantially proportional to the mobility, increases in carrier concentraiton in this high-concentration range produce substantial decreases in undesired current component by a mechanism not available at lower concentrations.

The physical basis for the occurrence of this marked decrease in mobility at extremely high carrier concentrations is believed to be the rapid increase in scattering of electrons by ionized impurity atoms which occurs at such concentrations. Thus, at low concentrations of ionized impurity atoms, electron scattering is primarily due to thermal vibrations of the crystal lattice, and the mobility is therefore substantially independent of carrier concentrations. However, when the density of ionized impurity atoms exceeds about $10^{18}$ atoms per cc., the scattering produced by such atoms becomes substantial, and above this value the mobility falls off rapidly with increased concentration.

Accordingly, by utilizing carrier concentrations of more than about $10^{18}$ carriers per cubic centimeter in the emitter region, the tendency of the extremely narrow width of the emitter region to increase greatly the undesired current component across the emitter junction is counteracted, and a high percentage of the emitter current is carried by the type of carrier which it is desired to inject into the base. This is identical with a high value of gamma. Furthermore, the impedance of such a junction when biased in the reverse direction is also somewhat higher when the mobility is thus reduced by extremely heavy doping of the semiconductor. Accordingly, a thin collector region such as 34 in Figure 2 possesses not only a high reverse alpha, but also low reverse current and high output impedance, as is desired in many circuit applications of transistors.

The necessary high concentrations for either emitter region or collector region in a germanium body have been found to be readily obtainable by utilizing gallium as the doping impurity, excess carrier concentrations of greater than $10^{19}$ carriers per cubic centimeter and excellent values of gamma and alpha being easily produced in this manner. Specific examples of typical materials, dimensions and performance characteristics of certain preferred embodiments of the invention will be set forth hereinafter in detail.

Although devices in accordance with the invention may be fabricated by any of several differing methods, a method which I have found particularly advantageous comprises first forming opposed surfaces of the semiconductive body in the configuration ultimately desired for the emitter and collector barriers, and with the desired spacing between them, and then forming upon the appropriate surface a melt containing an activator impurity of the type to form the desired emitter region. The amount of material in the melt, and the time and temperature of its application, are selected to provide the desired extremely shallow alloying of the metal with the underlying semiconductor. One general procedure for such fabrication will now be described with particular reference to Figure 3.

In the latter figure, the semiconductive device shown illustrates the condition of the device of Figure 1 as it exists just prior to formation of the emitter region by alloying. The body 10 may be of a single-crystalline semiconductive material such as germanium or silicon having a relatively high resistivity suitable for the base region of a transistor. The base tab 12 may conveniently be soldered to body 10 with a suitable ohmic solder prior to formation of the emitter or collector junctions, so as to provide convenient support and electrical connection during processing. The opposed depressions 14 and 15 may then be provided in body 10 by jet-electrolytic etching, as taught in the above-mentioned copending application Serial No. 472,824, to leave between the depressions a region of semiconductive material having the desired small thickness and substantially plane-parallel opposite surfaces. The small metallic deposits 16A and 20A may be formed upon the opposed, substantially plane-parallel surface regions at the bottoms of depressions 14 and 15 respectively, by jet-electrolytic plating, as is also taught in application Serial No. 472,824. Preferably the amount of material so deposited is sufficiently small that, even if heated slightly above its melting point and left in contact with the semiconductive surface for a relatively long period of time, the amount of penetration of the metal into the semiconductive body will not be large compared to the thickness of emitter and collector regions ultimately desired. By thus limiting the amount of coating metal utilized, the effects of small variations in the time of alloying upon the thickness of the emitter region are substantially reduced. The material of deposit 16A is preferably one which is mechanically stable under normal operating temperatures and to which the leads 18 and 22 can readily be soldered, and also preferably has a relatively low melting point so that low-temperature alloying may be employed in the subsequent steps.

To accomplish the desired type of ultra-shallow alloying, a small amount of a suitable activator substance 38, such as gallium, may be applied to the emitter contact as shown, the activator material preferably being one which has a high solid solubility in the material of the semiconductor and a low melting point, the solid solubility thereof preferably being substantially greater than that of the metal of deposit 16A. The activator material 38 and the metal of deposit 16A may then be heated for a short period of time to a temperature just sufficient to melt both substances and to produce an extremely small amount of alloying of both with the underlying semiconductor surface. Typically the materials are heated to a temperature of only about 170° centigrade for a few seconds. Because of the high degree of wetting between the coating metal and the semiconductor when the metal is applied by jet-electrolytic plating, low-temperature alloying to a very small depth is possible without "balling up" of the melt and resultant loss of control of the configuration of the alloyed region.

To accomplish this heating and alloying, there may be employed a heating element 40 having a hairpin-like wire loop 42 which is heated by electric current from a suitable source 44. The loop 42 may be placed sufficiently near the emitter contact to heat it by radiation, typically for a period of time just long enough to produce observable melting or "sagging" of the aggregate of the activator material and the adjacent deposited metal, at which time the heating current may be interrupted and the body cooled to form the desired ultra-thin emitter region. When the collector is also to be of the alloy-junction type, the body 10 may be turned over so that the deposit 20A is uppermost, a suitable small body of activator material applied thereto as in the case of the emitter element, and the heating, melting, shallow-alloying and cooling steps repeated to form the collector region.

The leads 18 and 22 may then be soldered to the emitter and collector contacts respectively, using a solder consisting of indium and cadmium in eutectic mixture. Preferably this soldering is accomplished at a low temperature and with a short duration of heating, so that no substantial amount of melting of the contact occurs during the soldering step. Appropriate heating for the soldering operation may be applied by passing an electric current through a portion of the respective leads for a short period of time.

In one exemplary case the precise conditions and materials employed in fabrication and the physical and electrical properties of the resultant device were as follows. A rectangular wafer of N-type germanium of about 1 ohm-centimeter resistivity and 100 microseconds lifetime was machined and etched to a substantially uniform thickness of about three mils, and a nickel base tab soldered thereto near one end of the wafer, using a lead-tin-antimony solder to produce a substantially ohmic connection. The wafer was then cleaned by sequential immersion in $H_2O$ and $C_2H_4O_2$, and supported in a conductive holder by its base tab. A pair of jets were then formed of an electrolyte comprising 7.7 grams of $In_2(SO_4)_3$, 11 grams of $NH_4Cl$, 0.5 gram of sodium laurate and 1 liter of $H_2O$. The jets employed in this case were about 5 and 7 mils in diameter, respectively, were applied to opposite sides of the wafer near its center, and were biased negatively with respect to the base tab to produce jet-electrolytic etching of a pair of opposed, flat-bottomed depressions in the body. Infrared monitoring of the thickness of the material remaining between the bottoms of the depressions was utilized to permit arresting of the etching when the thickness had been reduced to about 0.1 mil, following the general procedure described in the copending application Serial No. 449,347 of R. N. Noyce, filed August 12, 1954, and entitled "Electrical Method and Apparatus."

The polarity of the applied potential was then reversed to produce jet-electrolytic plating of indium metal upon the bottoms of the depressions, the indium deposit in each case being roughly one mil in thickness at its center. The wafer carrying the opposed indium dots was then cleaned by immersing it in $H_2O$ for about 5 seconds. The diameter of the indium dot produced by the smaller jet was then about 6 mils, and that of the dot produced by the larger jet was about 8 mils. The smaller dot ultimately served as the emitter contact, while the larger dot served as the collector contact. The dots of indium thus deposited provided surface-barrier contacts, and, by reverse-biasing the collector contact, an experimental measurement of the punch-through voltage was obtained to provide an indication of the thickness of the semiconductive body between the contacts prior to alloying.

Next a tiny pellet of gallium, having a volume equal to that of a sphere of about 1 mil diameter, was placed on the emitter contact with the germanium wafer oriented as in Figure 3 so that the emitter contact was uppermost. This amount of gallium is about 1% of the amount of indium in the deposit, an amount which has been found great enough to determine the junction characteristics and small enough to avoid creation of a contact too soft for satisfactory lead attachment. A hair-pin loop such as that of Figure 3 was heated by passing electric current through it, and was held about 1/16" from the emitter contact until a "sagging" of the indium deposit was seen, indicating that melting had occurred. The heating time was several seconds, and the temperature reached by the melt was about 170°. The current through the wire loop was then discontinued, and the assembly allowed to cool for about a minute. The semiconductive body was then inverted, a pellet of gallium similar to that previously applied to the emitter contact was applied to the collector contact, and current was again passed through the wire loop for a brief period sufficient to melt momentarily the indium of the collector contact. The assembly was then cooled again to recrystallize the material.

Appropriate leads were fastened to the two opposed contacts by quick-soldering with indium-cadmium eutectic solder, by placing one end of each lead against one of the contacts, applying the solder to the lead above the point of contact, and passing an electric current through a portion of the lead for a time and in an amount sufficient to melt the solder without melting the indium contact. The resultant device was then cleaned by dipping it in a solution comprising 15 cc. of $C_2H_4O_2$, 8 cc. of $HNO_3$ and 5 cc. of HF, for about 2 seconds.

Measurements of the punch-through voltage were then made for the completed transistor. These measurements indicated that the distance between emitter and collector junctions was less than the body thickness determined in the previously mentioned punch-through measurement by about .002 mil, indicating an emitter region thickness of about .001 mil and a similar thickness for the collector region. This value of emitter region thickness was found also to agree with that to be expected from alloying of indium contacts into N-type germanium at a temperature of about 170° C.

The average equilibrium concentration of holes in the emitter region was determined by measurements of the variation of the grounded-emitter current gain $\beta$ of the transistor with increases in collector current, and by measurements of the resistivity of similarly made, but larger, emitter regions. The results of these measurements indicated that the charge carrier concentration in the emitter region of the device fabricated in the manner described was greater than $10^{19}$ per cc.

The resultant transistor was tested and found to have the following characteristics, measured at a collector-to-base voltage of −3 volts and a collector current of 1 milliampere:

Emitter resistance $r_e$=33 ohms
Collector resistance $r_c$=2.92 megohms
Collector capacity $C_c$=3.78 micromicrofarads
Maximum oscillation frequency $f_{max}$=61 megacycles per second
Maximum collector voltage $V_{max}$=8 volts
Grounded-base current gain=.9928
Grounded-emitter current gain $\beta$=138
Average $\beta$ measured at 10 milliamperes=192
Average $\beta$ measured at 20 milliamperes=172
Average $\beta$ measured at 50 milliamperes=118

The improvement produced by the heavy doping with gallium was also checked by fabricating transistors in the same manner described in detail hereinbefore, with the exception that the gallium was omitted and only the indium was alloyed with the germanium. The alpha of the resultant transistor was about .97 at one milliampere as compared to .99 with gallium activation, and the corresponding value of $\beta$ was about 32 as compared to 138. At about 50 milliamperes the average $\beta$ fell to about 5, as compared with a value of 118 for the gallium-activated transistor embodying the invention. Investigation of the indium-activated junction device disclosed that, while the width of the emitter region was about the same as when gallium was used, the hole concentration in the emitter region was substantially lower, i. e. of the order of $10^{17}$ carriers/cc. The mobility of electrons in the emitter was therefore about 10 times greater than when gallium was employed, and the undesired electron current about 100 times larger for this reason.

Although the invention has been described with particular reference to gallium-doped emitter regions in N-type germanium bodies, it may also be practised in other forms in which an emitter region of the specified small width and high excess-carrier concentration is employed. For example, aluminum may be utilized in place of gallium in fabricating P-type emitter regions, and when the emitter region is to be of N-type germanium, the doping impurity substance may be arsenic, antimony or bismuth. For a P-type silicon emitter, the impurity substance may be boron, and for an N-type silicon emitter phosphorous, arsenic or antimony may be used. To obtain emitter regions having thicknesses of substantially less than 0.01 mil and high values of gamma, the ionized impurity atom concentration should be substantially greater than about $10^{18}$ atoms per cc. in each case, corresponding to a resistivity of less than about 0.01 ohm-centimeter, and for emitter thicknesses in the preferred range of about 0.001 mil or less the concentration should be more than about $10^{19}$ atoms per cc., corresponding to a resistivity of less than about 0.004 ohm centimeter.

It will also be understood that the method of fabrication may also depart substantially from that described in detail hereinbefore. For example, the semiconductive base material may be prepared and shaped by techniques other than jet-electrolytic etching; also, the activator substance, e. g. gallium, and the principal metal component of the melt employed in the preferred embodiment, e. g. indium, may be applied simultaneously as by simultaneous electroplating, or the activator substance may even be applied to the semi-conductive body before the principal component.

Accordingly, it will be understood that the invention may take any of a variety of forms differing from those specifically exemplified hereinbefore, without departing from the scope of the invention.

I claim:

1. As the emitter region of a semiconductive device, a body of semiconductive material having a thickness of less than 0.01 mil and containing an average concentration of ionized activator impurity atoms of greater than about $10^{18}$ atoms per cubic centimeter.

2. The emitter region of claim 1 in which said semiconductive body is selected from the class comprising germanium and silicon.

3. The emitter region of claim 1, in which said thickness is less than about 0.001 mil and said concentration is greater than $10^{19}$ atoms per cubic centimeter.

4. The emitter region of claim 1 in which said semiconductive body is of P-type germanium and said activator impurity atoms are of gallium.

5. The emitter region of claim 1, in which said body of semiconductive material is characterized by an average resistivity of less than about 0.01 ohm-centimeter.

6. The emitter region of claim 5 in which said resistivity is of the order of 0.001 ohm-centimeter.

7. A transistor device, comprising a body of semiconductive material providing a base region, an alloy region on one side of said body providing an emitter region, and a second alloy region on the opposing side of said body providing a collector region, each of said emitter and collector regions having a width substantially less than 0.01 mil and containing an average concentration of ionized activator impurity atoms of more than about $10^{18}$ atoms per cubic centimeter.

8. The method of fabricating an alloy-junction emitter having a predetermined desired configuration, comprising shaping a surface region of a semiconductive body to the configuration desired for the junction, and alloying an activator substance into said region to a depth of less than substantially 0.01 mil and in an amount sufficient to produce an average concentration of ionized activator impurity atoms in said alloyed region of greater than about $10^{18}$ atoms per cubic centimeter.

9. A method in accordance with claim 8, in which said alloying comprises coating said surface region with a first metal, applying to said coated metal an activator substance having a higher solid solubility in said semiconductive material than said coated metal, both of said coated metal and activator material having low melting points, and heating both said coated metal and said activator material to an extent just sufficient to cause them to melt.

10. A method in accordance with claim 8, in which said body is of N-type germanium and said activator substance is of gallium.

References Cited in the file of this patent

UNITED STATES PATENTS

| | | |
|---|---|---|
| 2,709,232 | Thedieck | May 24, 1955 |
| 2,750,542 | Armstrong et al. | June 12, 1956 |